US008441115B2

(12) United States Patent
Mochizuki et al.

(10) Patent No.: US 8,441,115 B2
(45) Date of Patent: May 14, 2013

(54) SEMICONDUCTOR DEVICE WITH EXPOSED THERMAL CONDUCTIVITY PART

(75) Inventors: Chihiro Mochizuki, Ome (JP); Hiroshi Kikuchi, Hidaka (JP); Yoichiro Kobayashi, Ome (JP); Yasuo Shima, Ome (JP)

(73) Assignee: Hitachi, Ltd., Tokyo (JP)

( * ) Notice: Subject to any disclaimer, the term of this patent is extended or adjusted under 35 U.S.C. 154(b) by 1 day.

(21) Appl. No.: 13/171,801

(22) Filed: Jun. 29, 2011

(65) Prior Publication Data
US 2012/0001315 A1 Jan. 5, 2012

(30) Foreign Application Priority Data
Jun. 30, 2010 (JP) .................................. 2010-148492

(51) Int. Cl.
*H01L 23/34* (2006.01)
(52) U.S. Cl.
USPC ...... 257/690; 257/E23.08; 257/686; 257/685; 257/777; 257/723; 257/724; 257/728; 257/796; 257/684
(58) Field of Classification Search ................... 257/690, 257/E23.08, 686, 685, 777, 723, 724, 728, 257/796, 684
See application file for complete search history.

(56) References Cited

U.S. PATENT DOCUMENTS 7,906,854 B2 * 3/2011 Miyagawa ..................... 257/777
8,125,077 B2 * 2/2012 Sirinorakul et al. .......... 257/707
8,247,891 B2 * 8/2012 Wen et al. ...................... 257/675
2001/0015492 A1 * 8/2001 Akram et al. .................. 257/706
2004/0046241 A1 * 3/2004 Combs et al. .................. 257/678
2006/0267188 A1 * 11/2006 Ishino et al. ................... 257/723
2010/0133675 A1 * 6/2010 Yu et al. ......................... 257/686
2010/0258932 A1 * 10/2010 Yoshida et al. ................ 257/686
2011/0272824 A1 * 11/2011 Pagaila .......................... 257/777
2012/0025398 A1 * 2/2012 Jang et al. ...................... 257/777
2012/0098145 A1 * 4/2012 Yoshida et al. ............... 257/774

OTHER PUBLICATIONS

Sato, "Packaging Technology for SiP (System in Package)", Journal of Japan Institute of Electronics Packaging, Jun. 2004, vol. 7, No. 2, pp. 111-115.

* cited by examiner

*Primary Examiner* — A O Williams
(74) *Attorney, Agent, or Firm* — Miles & Stockbridge P.C.

(57) ABSTRACT

A semiconductor package includes a print circuit part, a lower chip, an upper chip, a thermal conductivity part, and an encapsulation resin. The lower chip and the upper chip are mounted on the print circuit part through wire bonding connection. The thermal conductivity part efficiently dissipates heat from the chips to the outside of the package. The encapsulation resin entirely seals the package while exposing the thermal conductivity part. A adhesive sheet is hardened to form a bonding layer between the thermal conductivity part and the upper chip, a bonding layer between the semiconductor chips, and a bonding layer between the semiconductor chip and the wired component. The configuration contributes to miniaturization, high integration, and heat resistance reduction of a semiconductor package using high-heat-generating ICs.

11 Claims, 13 Drawing Sheets

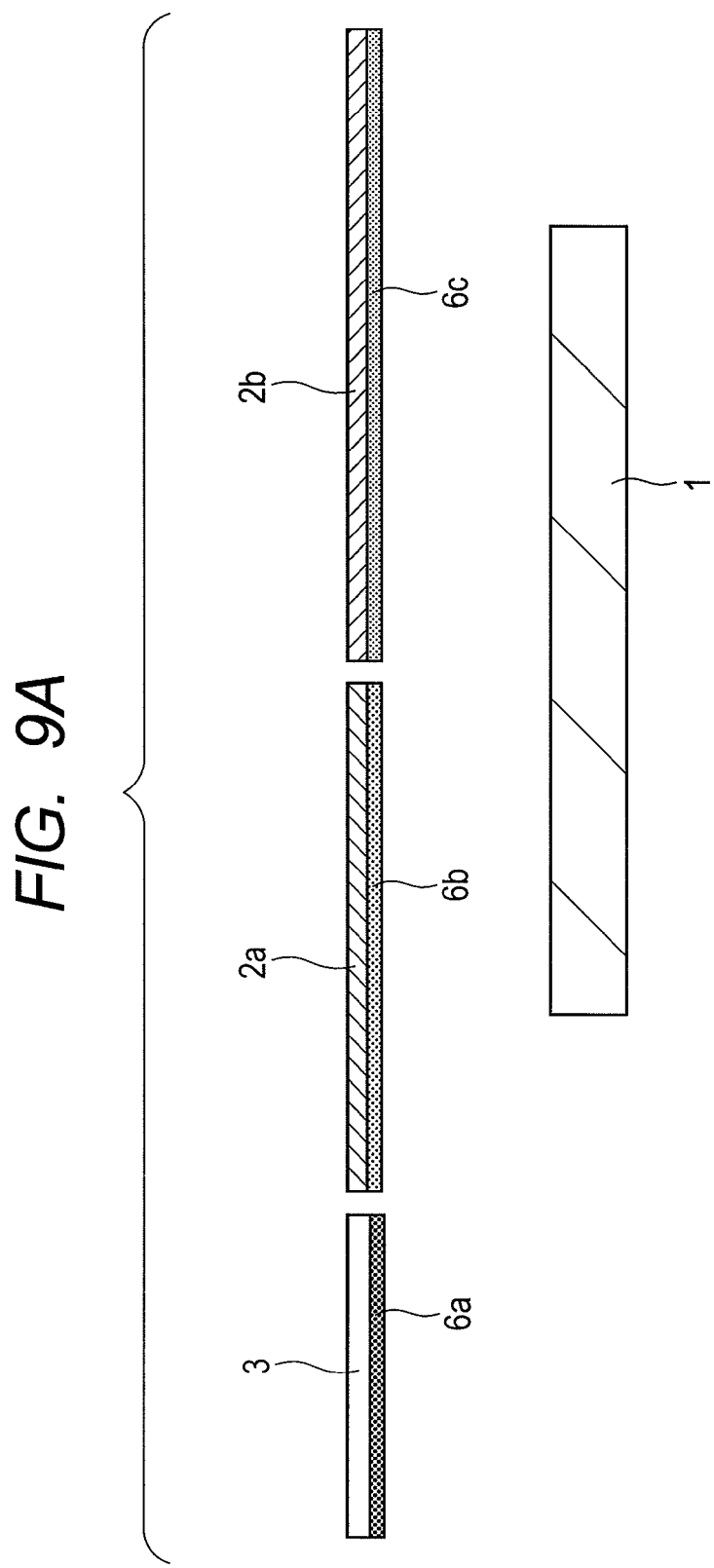

(a-1)

(a-2)

(a-3)

SECTION A-A'

ENLARGED VIEW OF PORTION B

000
SEMICONDUCTOR DEVICE WITH EXPOSED THERMAL CONDUCTIVITY PART

CLAIM OF PRIORITY

The present application claims priority from Japanese patent application JP 2010-148492 filed on Jun. 30, 2010, the content of which is hereby incorporated by reference into this application.

FIELD OF THE INVENTION

The present invention relates to a semiconductor device. More particularly, the invention relates to a technology effective for heat resistance reduction, miniaturization, high integration, and cost reduction of a semiconductor device.

BACKGROUND OF THE INVENTION

The system-in-package (SIP) technology is effective for providing highly functional and integrated semiconductor devices. The SIP includes the chip-stacked package technology of stacking semiconductor chips. This structure can highly integrate chips and is used in many fields. For example, see: SATO Toshihiko, Packaging Technology for SiP (System in Package) (<Special Articles> Recent Jisso Technology for SiP and Its Future Trend), Journal of Japan Institute of Electronics Packaging, June 2004, Vol. 7, No. 2, pp. 111-115.

SUMMARY OF THE INVENTION

As described in "Packaging Technology for SiP," a package of semiconductor chips placed in a planar direction can more easily dissipate heat from the semiconductor chips to the outside and more effectively reduce heat resistance than a package of stacked semiconductor chips. However, a packaging area depends on the total size of semiconductor chips so as to two-dimensionally place the semiconductor chips on a plane. The packaging area becomes larger than a package of stacked semiconductor chips. The miniaturization and the high integration are impossible.

As described in "Packaging Technology for SiP," semiconductor chips may be three-dimensionally stacked as a chip-stacked package. The chip-stacked package can provide a packaging area smaller than the total size of semiconductor chips. The package can be more miniaturized and highly integrated than a package of semiconductor chips placed in a planar direction. Since semiconductor chips are stacked, however, the amount of heat generation per package unit area increases to hamper heat dissipation to the outside of the package.

The SIP of the related art provides no structure enabling all of heat resistance reduction, miniaturization, and high integration needed for semiconductor packages and imposes restrictions on high functionality and miniaturization of electronic devices.

Prior to the present application, the inventors tried to three-dimensionally stack semiconductor chips using liquid adhesive. However, the liquid adhesive is subject to a load of stacking the semiconductor chips when controlling the thickness of a bonding layer. The thickness easily varies, making it difficult to control the bonding layer thickness and the heat dissipation and achieve heat resistance reduction and miniaturization in consequence of making the package thinner.

The present invention has been made in consideration of the foregoing. It is therefore an object of the invention to provide a structure capable of heat resistance reduction, miniaturization, and high integration needed for semiconductor packages and contribute to high functionality and miniaturization of electronic devices.

It is another object of the invention to provide a technology capable of price reduction of semiconductor devices.

These and other objects and novel features of the invention may be readily ascertained by referring to the following description and appended drawings.

The following summarizes the representative aspects of the invention disclosed in this application.

A semiconductor device includes: multiple stacked semiconductor chips; a thermal conductivity part mounted on a device formation surface of the topmost semiconductor chip; and an encapsulation resin that seals the semiconductor chips. The thermal conductivity part is exposed from a surface of the encapsulation resin. The semiconductor chips, the topmost semiconductor chip, and the thermal conductivity part are stacked through a bonding layer. A adhesive sheet is hardened to form the bonding layer.

The invention enables miniaturization and heat resistance reduction of semiconductor packages and control over heat dissipation thereof.

BRIEF DESCRIPTION OF THE DRAWINGS

FIG. 9A shows a process of preparing members in the semiconductor device manufacturing method according to the first embodiment;

DETAILED DESCRIPTION OF THE PREFERRED EMBODIMENTS

First Embodiment

Figure 1A:
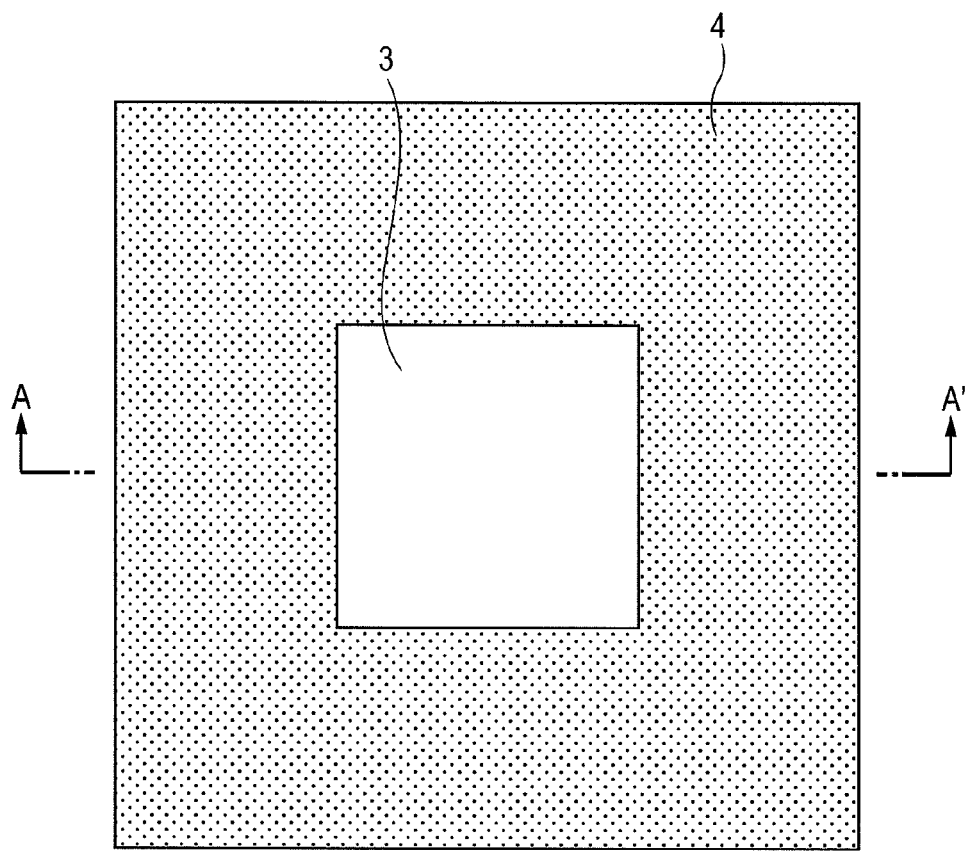
FIG. 1A exemplifies a plan view of a semiconductor device according to a first embodiment.

Embodiments of the present invention will be described in further detail with reference to the accompanying drawings.

The following description includes multiple embodiments or sections as needed. Unless expressly stated otherwise, the embodiments are not unrelated to each other. One of the embodiments provides modifications, details, or supplements for all or part of the others.

The embodiments to be described may refer to numeric values including the number of elements or items, quantities, and ranges. The embodiments are not limited to but may be greater or smaller than specific numeric values, unless expressly stated otherwise, or unless the embodiments are limited to specific numeric values in principle.

Obviously, constituent elements including procedure steps are not necessarily requisite for the embodiments, unless expressly stated otherwise, or unless the elements are requisite in principle.

The embodiments include those virtually approximate to or similar to shapes and positional relation of the constituent elements stated in the description, unless expressly stated otherwise, or unless considered inappropriate in principle. The same applies to the above-mentioned numeric values and ranges.

Throughout the drawings for illustrating the embodiments, members having the same function when shown in more than one figure are designated by the same reference numerals and a repetitive description is omitted for simplicity.

Figure 1B:
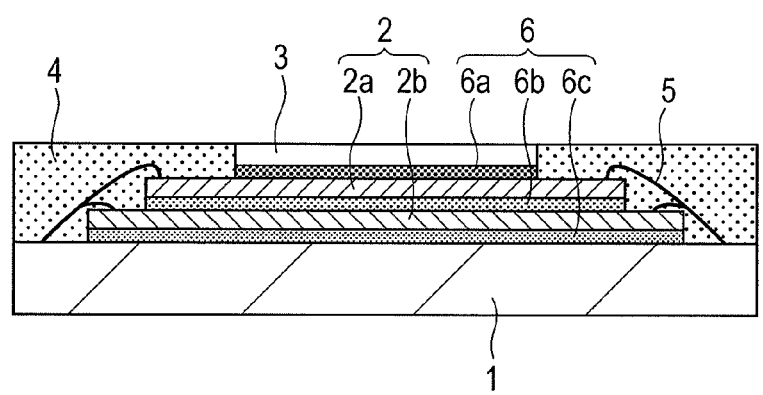
FIG. 1B exemplifies a sectional view of the semiconductor device according to the first embodiment.

FIG. 1A exemplifies a plan view of a semiconductor device according to a first embodiment. FIG. 1B shows a section A-A' in FIG. 1A. As shown in FIG. 1A, a thermal conductivity part 3 is exposed from the surface of an encapsulation resin 4. As shown in FIG. 1B, the semiconductor device includes a print circuit part 1, a semiconductor chip 2 (lower chip 2b and upper chip 2a), the thermal conductivity part 3, the encapsulation resin 4, and an adhesive sheet 6. The semiconductor chip 2 is connected to and mounted on the print circuit part 1 through a bonding wire 5. The thermal conductivity part 3 is mounted on a device formation surface of the upper chip 2a and efficiently dissipates chip heat to the outside of the package. The encapsulation resin 4 entirely seals the semiconductor chip with the thermal conductivity part 3 exposed. The adhesive sheet 6 includes a adhesive sheet 6a between the thermal conductivity part and the upper chip, a adhesive sheet 6b between semiconductor chips, and a adhesive sheet 6c between the semiconductor chip and wired components.

The thermal conductivity part 3 is made of silicon or alumina ceramic or metal such as copper, for example.

A semiconductor chip can be mounted on the adhesive sheet whose thickness is almost the same as that before shipment. By contrast, the liquid adhesive is subject to a load of stacking the semiconductor chips when controlling the thickness of a bonding layer. The liquid adhesive more easily causes thickness variations than the adhesive sheet and makes it difficult to control the bonding layer thickness.

As characteristics of the embodiment, the thermal conductivity part 3 is exposed from the surface of the encapsulation resin 4. In addition, the adhesive sheet is hardened to form the bonding layer between the thermal conductivity part and the upper chip, the bonding layer between the semiconductor chips, and the bonding layer between the semiconductor chip and the wired component.

Compared to the configuration using the liquid adhesive, the adhesive sheet enables control over the bonding layer thickness and heat dissipation. In addition, the bonding layer can be thinned. The semiconductor package is capable of heat resistance reduction and miniaturization. Providing the thermal conductivity part exposed from the surface of the encapsulation resin contributes to heat resistance reduction of the semiconductor package.

Figure 2:
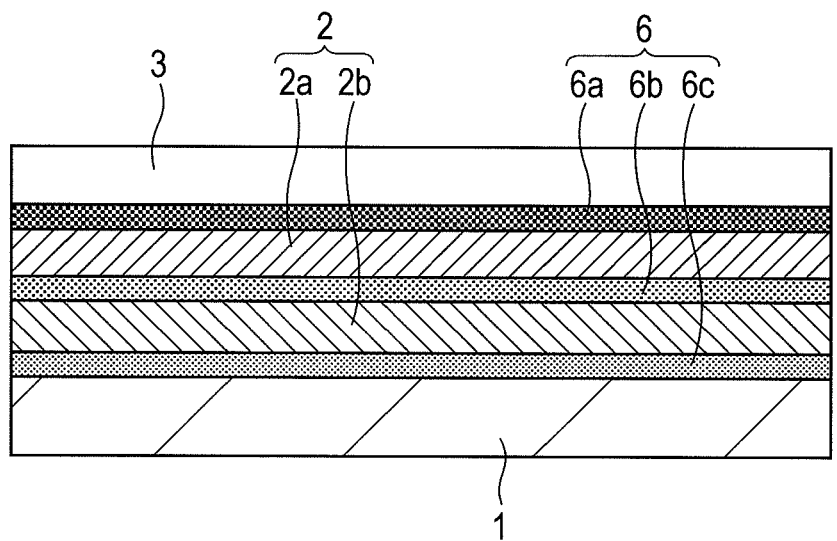
FIG. 2 exemplifies an enlarged sectional view of bonding between a thermal conductivity part and a semiconductor chip, between semiconductor chips, and between a semiconductor chip and a print circuit part.

FIG. 2 is an enlarged sectional view showing a bonding structure between the thermal conductivity part 3 and the upper chip 2a, between the upper chip 2a and the lower chip 2b, and between the lower chip 2b and the print circuit part 1.

In FIG. 2, the same thickness is used for the adhesive sheet 6a between the thermal conductivity part and the upper chip, the adhesive sheet 6b between the semiconductor chips, and the adhesive sheet 6c between the semiconductor chip and the print circuit part.

Using as thin a adhesive sheet as possible is effective, for improving the radiation performance of all the stacked semiconductor chips and enabling heat resistance reduction of the semiconductor package. It is effective to use a thin adhesive sheet with the same thickness for the adhesive sheet 6a between the thermal conductivity part and the upper chip, the adhesive sheet 6b between the semiconductor chips, and the adhesive sheet 6c between the semiconductor chip and the print circuit part.

The use of a material according to the same specification (sheet thickness) is also effective for the manufacturing management and costs.

Figure 3:
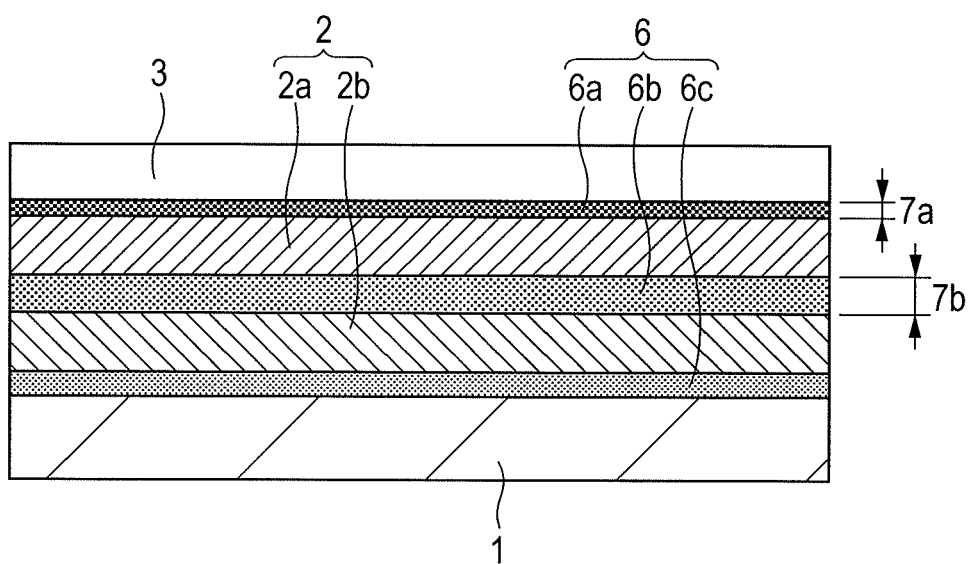
FIG. 3 exemplifies a sectional view of the semiconductor device including a adhesive sheet with the thickness changed from FIG. 2.

FIG. 3 is an enlarged sectional view illustrating a bonding structure between the thermal conductivity part 3 and the upper chip 2a, between the upper chip 2a and the lower chip 2b, and between the lower chip 2b and the print circuit part 1. Since the bonding layer thickness can be controlled, FIG. 3 shows capability of varying adhesive sheet thicknesses in accordance with characteristics of the upper chip 2a and the lower chip 2b. Designing the thickness of the adhesive sheet can control the heat resistance and heat dissipation of the bonding layer.

For example, the semiconductor device is configured so that the upper chip 2a features a larger amount of heat generation than the lower chip 2b. The heat resistance between the upper chip 2a and the thermal conductivity part 3 is designed to be smaller than that between the upper chip 2a and the lower chip 2b. Heat generated from the upper chip 2a can be efficiently conducted and dissipated to the outside of the semiconductor device.

When the lower chip 2b is a thermally sensitive semiconductor device, decreasing a thermal gradient in the chip is important for stabilizing the performance. Designing a large heat resistance between the upper chip 2a and the lower chip 2b can decrease a heat effect from the upper chip 2a to the lower chip 2b.

For this reason, a thickness 7a between the thermal conductivity part and the upper chip is designed to be small. A thickness 7b between the semiconductor chips is designed to be large. This design can efficiently dissipate heat from the upper chip 2a and decrease the thermal gradient in the lower chip 2b.

Figure 4:
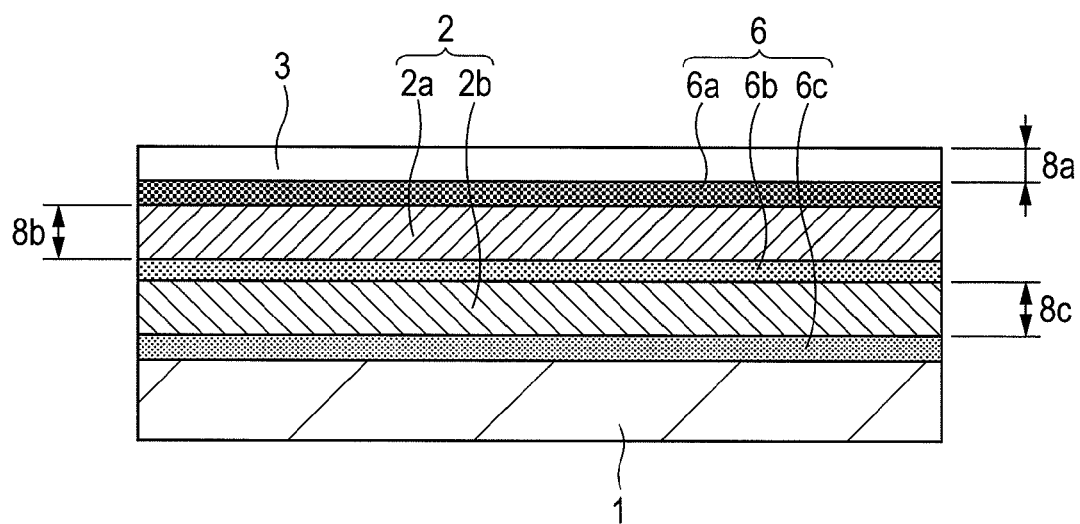
FIG. 4 exemplifies a sectional view of the semiconductor device including a thermal conductivity part thinner than the semiconductor chip as shown in FIG. 2.

FIG. 4 is an enlarged sectional view illustrating a bonding structure between the thermal conductivity part 3 and the upper chip 2a, between the upper chip 2a and the lower chip 2b, and between the lower chip 2b and the print circuit part 1. A thickness 8a of the thermal conductivity part, a thickness 8b of the upper chip 2a, and a thickness 8c of the lower chip 2b are designed in accordance with characteristics of the upper chip 2a and the lower chip 2b. As shown in FIG. 4, the thermal conductivity part is thinner than the semiconductor chip. The upper chip is thicker than the lower chip.

For example, the semiconductor device is configured so that the upper chip 2a features a larger amount of heat generation than the lower chip 2b. Designing the thickness 8a of the thermal conductivity part 3 to be smaller than the thickness 8b of the upper chip 2a can efficiently conduct heat generated from the upper chip 2a to the thermal conductivity part 3. This is because the package heat resistance relates to heat conductivity of materials, a heat transfer area, and the thickness of a heat-conducting material. Thinning the thermal conductivity part 3 improves the radiation efficiency.

When the lower chip 2b is a thermally sensitive semiconductor device, designing the thickness 8b of the upper chip 2a to be larger than the thickness 8c of the lower chip 2b dissipates heat from the upper chip. This design can decrease a heat effect from the upper chip 2a to the thermally sensitive lower chip 2b.

Figure 5:
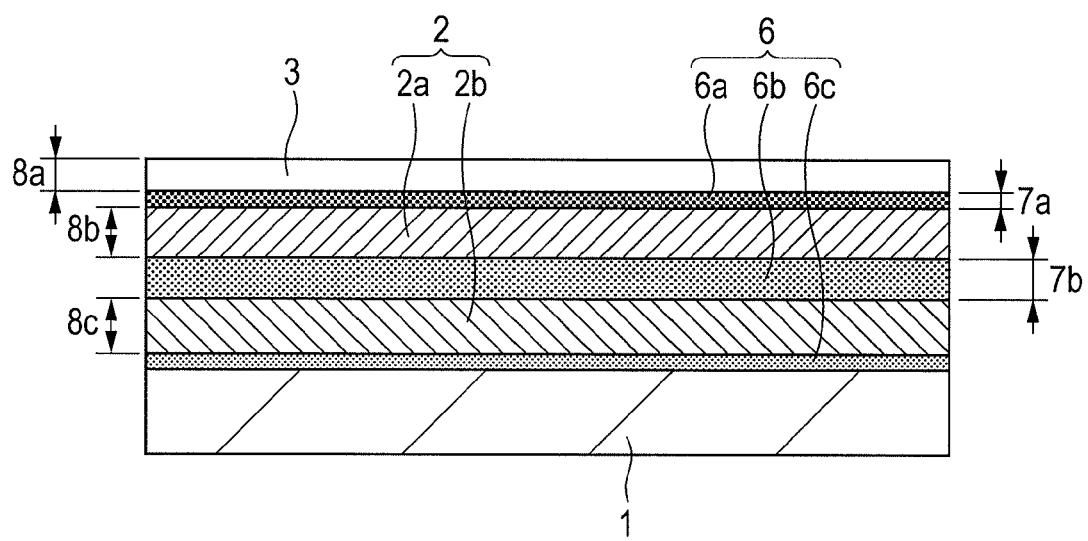
FIG. 5 exemplifies a sectional view of the semiconductor device including a adhesive sheet with the thickness changed from FIG. 2 and a thermal conductivity part thinner than the semiconductor chip.

FIG. 5 is a sectional view of a semiconductor device that combines the features described with reference to FIGS. 3 and 4. The semiconductor device decreases the thickness 7a between the thermal conductivity part 3 and the upper chip, increases the thickness 7b between the chips, decreases the thickness 8a of the thermal conductivity part 3, and increases the thickness 8b of the upper chip 2a. This design can efficiently conduct heat generated from the upper chip 2a to the thermal conductivity part 3 and decrease a heat effect from the upper chip 2a to the thermally sensitive lower chip 2b.

While FIGS. 1A through 5 use two semiconductor chips, the same effect is also applicable to three semiconductor chips or more.

Figure 6:
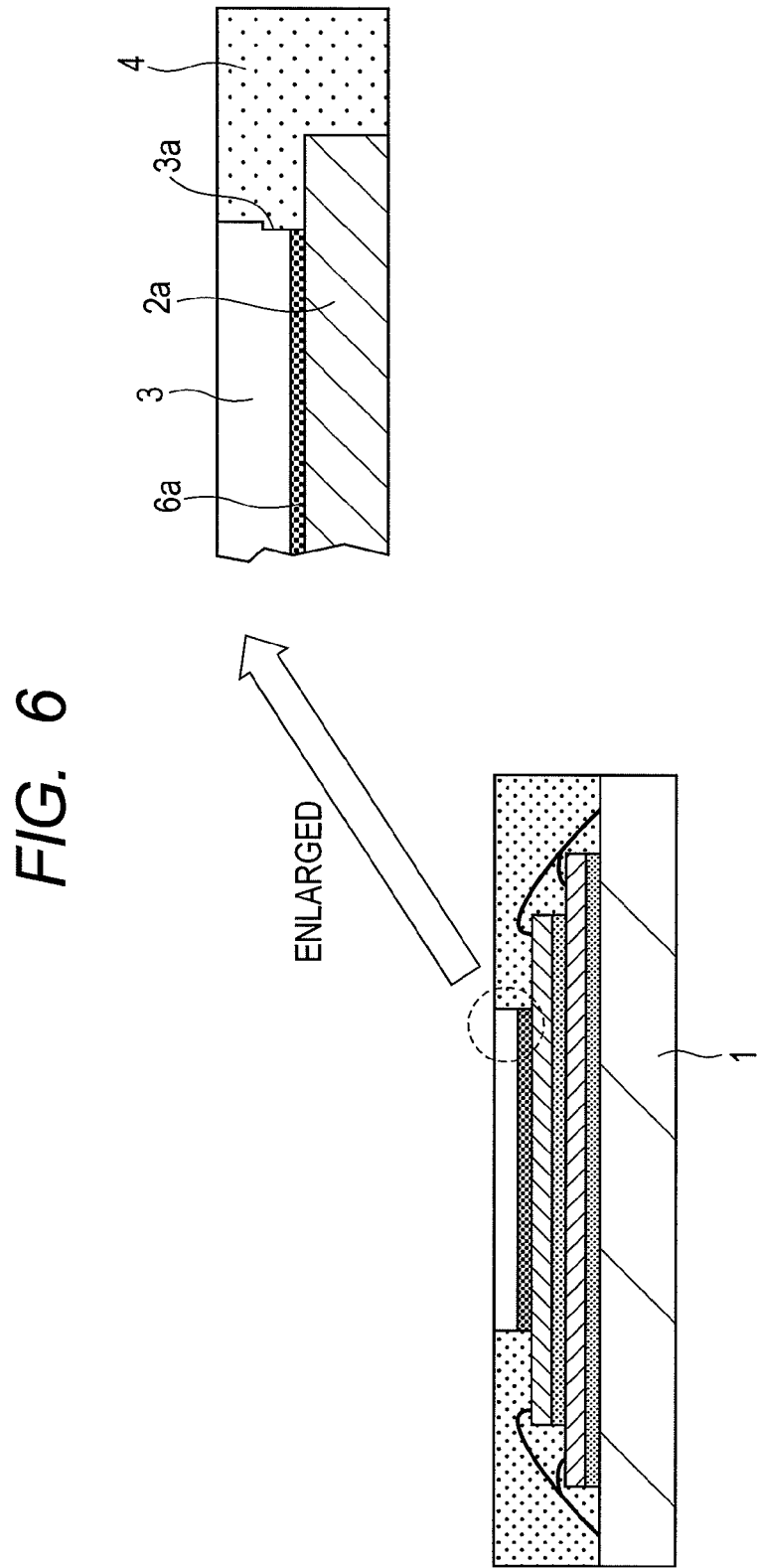
FIG. 6 exemplifies the thermal conductivity part having a stepped side.

FIG. 6 is a modification of the embodiment of the invention and shows a level difference 3a provided to the side of the thermal conductivity part 3 shown in FIG. 1B.

Methods of dicing the thermal conductivity part 3 include the step cut method that is based on two steps in order to prevent a tiny crack. Changing dicing cutter thicknesses causes the level difference on the side as shown in FIG. 6. FIG. 6 shows a package structure that exposes a large area of the thermal conductivity part 3 from the encapsulation resin 4 in order to increase the radiation performance of the thermal conductivity part 3.

Figure 7:
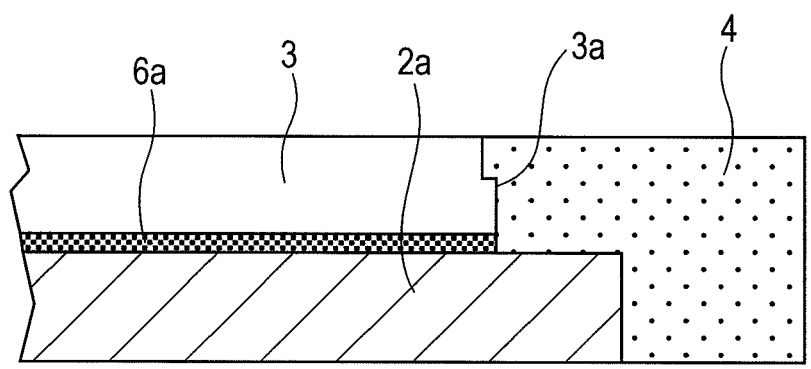
FIG. 7 shows a modification of FIG. 6.

FIG. 7 is a modification of FIG. 6 and shows a package structure that provides the level difference 3a and exposes a small area of the thermal conductivity part 2 from the encapsulation resin 4. Compared to FIG. 6, the structure in FIG. 7 reduces the area of the thermal conductivity part 3 exposed from the package surface and slightly decreases the radiation performance. On the other hand, the structure enlarges the area of bonding the thermal conductivity part 3 and the encapsulation resin 4 and increases durability of the semiconductor device.

For example, a stress may be applied to the package from outside to crack a periphery of the thermal conductivity part 3 exposed from the encapsulation resin 4. The crack stops at the level difference 3a on the side of the thermal conductivity part 3 and can be prevented from extending inside the package.

Figure 8A:
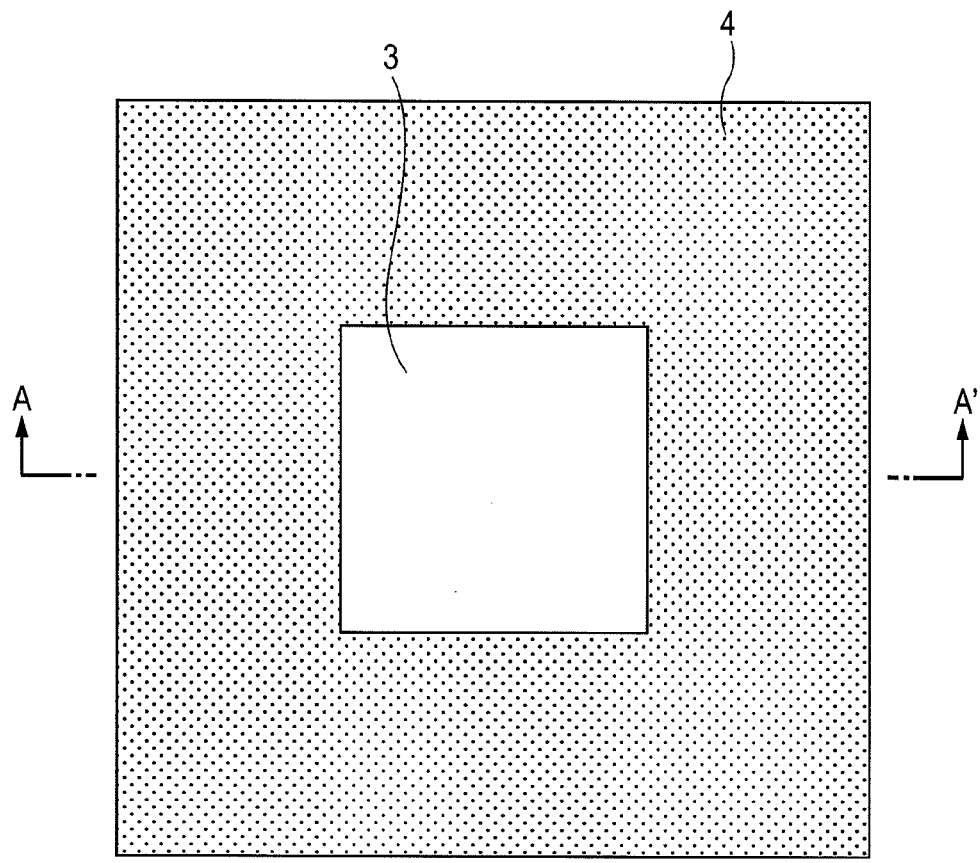
FIG. 8A exemplifies a plan view of a print circuit part using a printed circuit board.
Figure 8B:
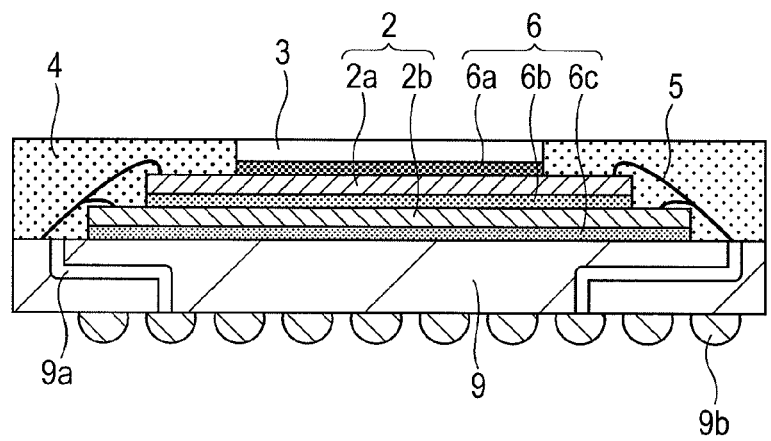
FIG. 8B exemplifies a sectional view of the print circuit part using a printed circuit board.

FIGS. 8A and 8B show a printed circuit board 9 that contains an internal circuit 9a and is provided as the print circuit part 1 used for the semiconductor device according to the embodiment. FIGS. 8A and 8B are a plan view and a cross sectional view illustrating a BGA package that forms a motherboard and solder balls 9b for connection under the printed circuit board 9. FIG. 8B shows section A-A' of FIG. 8A.

The print circuit part 1 may be designed as not only a BGA structure but also an LGA structure that replaces solder balls with flat electrode pads placed in a grid.

The print circuit part 1 may include a surface layer wiring and a grounded conductor layer that is internally formed through the surface layer wiring and an insulating layer.

The print circuit part 1 may use an FPC (Flexible Printed Circuit) or a lead frame to mechanically support the semiconductor chip if electric conduction is ensured between the semiconductor chip and an external terminal.

Figure 9B:
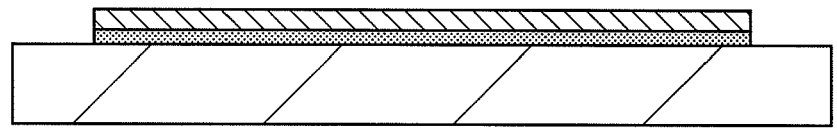
FIG. 9B shows a process of stacking chips in the semiconductor device manufacturing method according to the first embodiment.
Figure 9B:
Figure 9B:
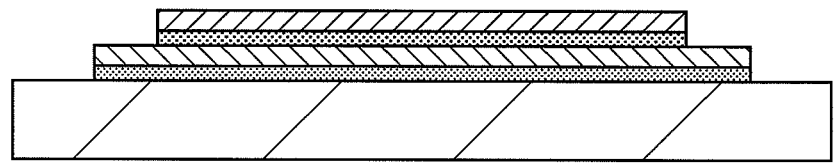
Figure 9B:
Figure 9B:
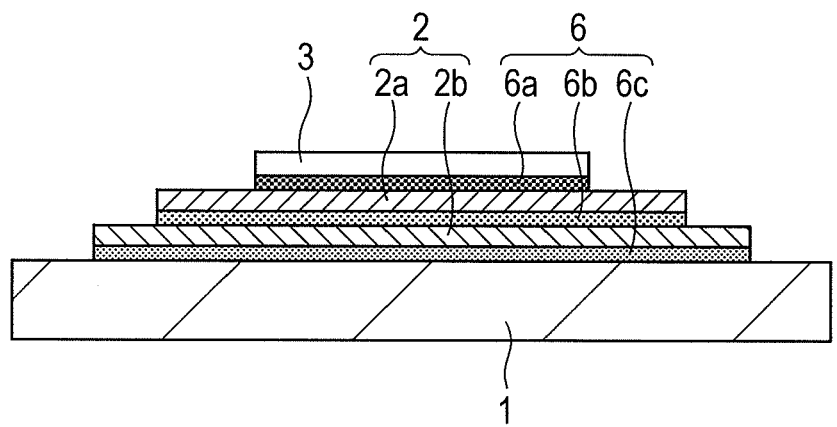
Figure 9C:
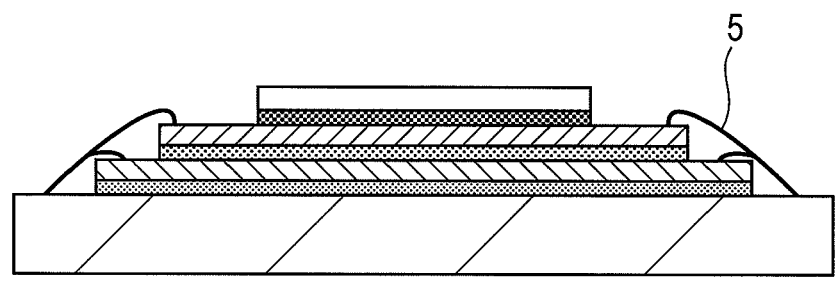
FIG. 9C shows a wire bonding process in the semiconductor device manufacturing method according to the first embodiment.
Figure 9D:
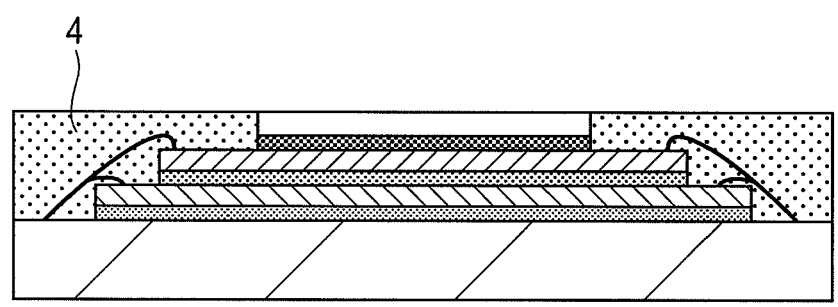
FIG. 9D shows a resin seal process in the semiconductor device manufacturing method according to the first embodiment.

FIGS. 9A through 9D are flowcharts exemplifying a manufacturing method of the semiconductor device according to the embodiment. FIG. 9A shows a process of preparing members. FIG. 9B shows a process of stacking chips. FIG. 9C shows a wire bonding process. FIG. 9D shows a resin seal process.

For example, the adhesive sheet used for the embodiment is supplied as a film functioning as dicing tape and a bonding agent, e.g., a dicing/die bonding film such as HF-900 manufactured by Hitachi Chemical Co., Ltd.

The member preparation process in FIG. 9A attaches the sheet-like film to the rear side of a silicon wafer, dices the wafer, and exposes it to ultraviolet light. The semiconductor chips 2a and 2b can be picked up with adhesive sheets 6b and 6c attached to the rear side of the chips. The thermal conductivity part 3 is also picked up with the adhesive sheet 6a attached to the rear side of the thermal conductivity part 3.

The chip stacking process in FIG. 9B temporarily pressure-bonds the lower chip 2b to the print circuit part 1 (a-1). The process then temporarily pressure-bonds the upper chip 2a onto the top surface of the lower chip (a-2). Finally, the process temporarily pressure-bonds the thermal conductivity part 3 onto the top surface of the upper chip (a-3).

The wire bonding process in FIG. 9C performs wire bonding using the bonding wire 5 to make electric connection between the semiconductor chip 2 and the print circuit part 1.

The resin seal process in FIG. 9D seals the package with resin so as to leave no gap between a package mold and the thermal conductivity part 3. The purpose is to expose the surface of the thermal conductivity part 3 and prevent the encapsulation resin 4 from covering the surface of the thermal conductivity part 3. The resin seal process hardens the adhesive sheet to form a bonding layer between the thermal conductivity part and the upper chip, a bonding layer between the chips, and a bonding layer between the semiconductor chip and the wired component. The process can control the bonding layer thickness and the heat dissipation. Thinning the bonding layers can decrease the heat resistance of the semiconductor package and miniaturize the semiconductor package.

Figure 10A:
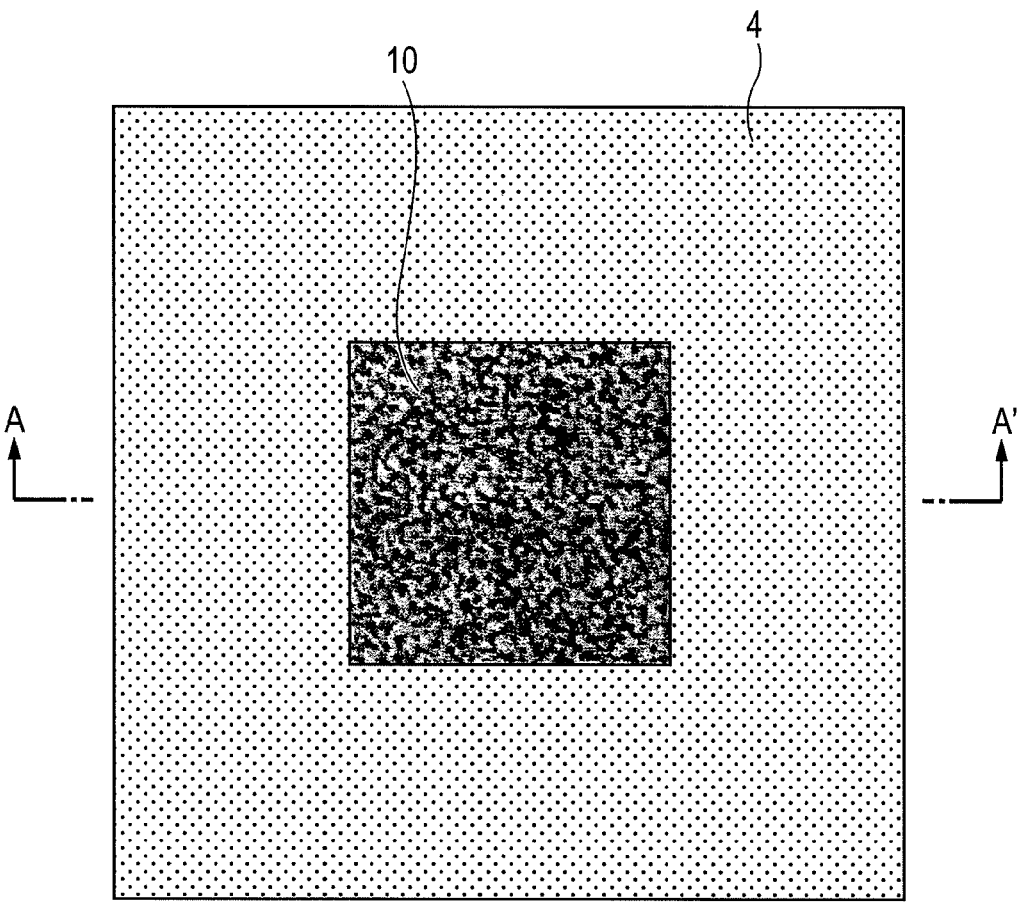
FIG. 10A exemplifies a plan view showing the thermal conductivity part having a dimpled surface.
Figure 10B:
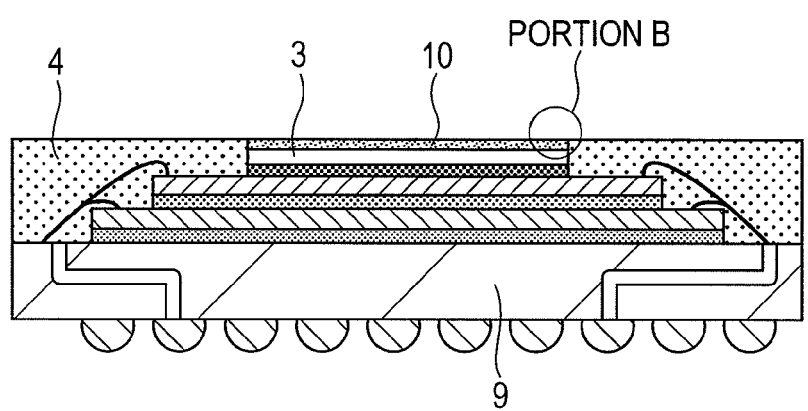
FIG. 10B exemplifies a sectional view showing the thermal conductivity part having a dimpled surface.
Figure 10C:
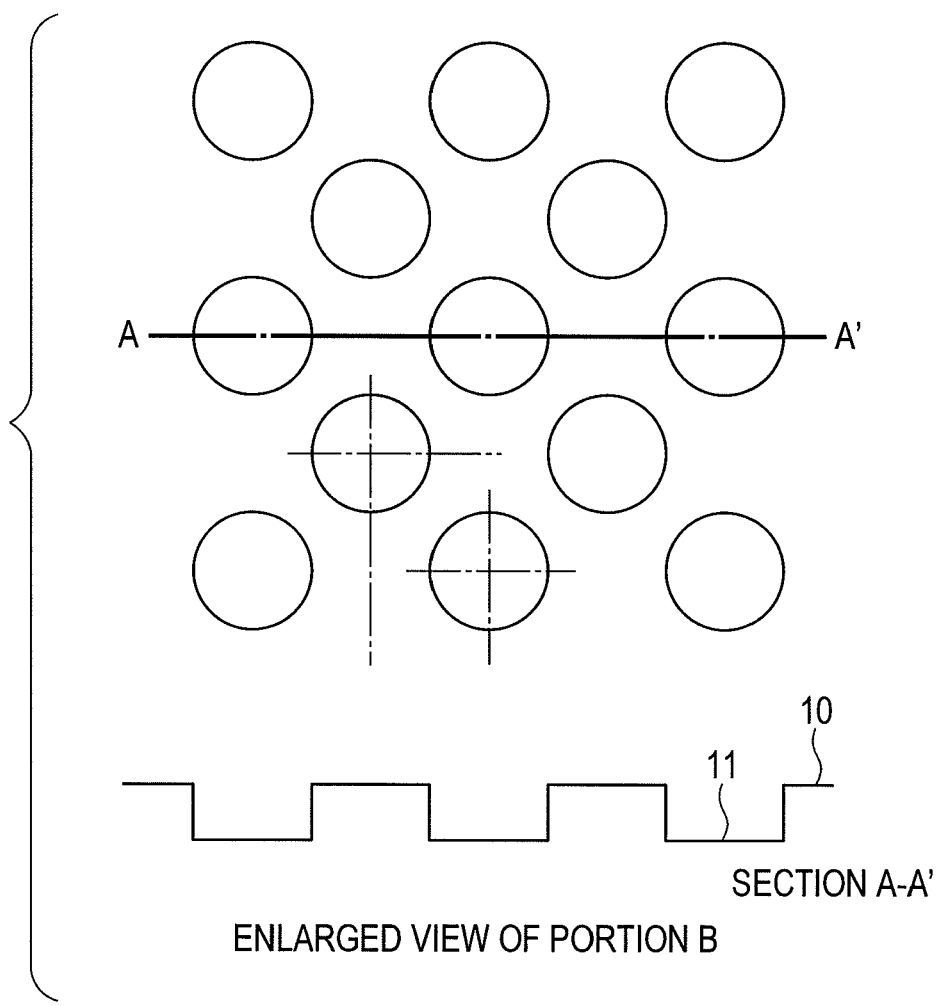
FIG. 10C exemplifies an enlarged view of a dimpled portion of the thermal conductivity part.

FIGS. 10A and 10B show a modification of the embodiment. FIG. 10A is a plan view showing the thermal conductivity part 3 having a dimpled surface. FIG. 10B shows section A-A' of FIG. 10A. FIG. 10C is an enlarged view of a dimpled portion of the thermal conductivity part.

The package heat resistance relates to heat conductivity of materials, a heat transfer area, and the thickness of a heat-conducting material. Increasing the area of the thermal conductivity part 3 can improve the radiation efficiency. However, increasing the size of the thermal conductivity part 3 also increases the package size and cannot miniaturize the package. It is effective to increase the surface area of the thermal conductivity part without changing the size of the thermal conductivity part 3 itself.

A technique of increasing the surface area of the thermal conductivity part 3 may fin or dimple an external exposure side of the thermal conductivity part. An example in FIG. 10C processes a dimple 11 on an external exposure side 10. Methods of forming the dimple 11 include a blast process of injecting metallic particles such as silica sand or nonmetallic particles and a chemical etching technique.

Figure 11A:
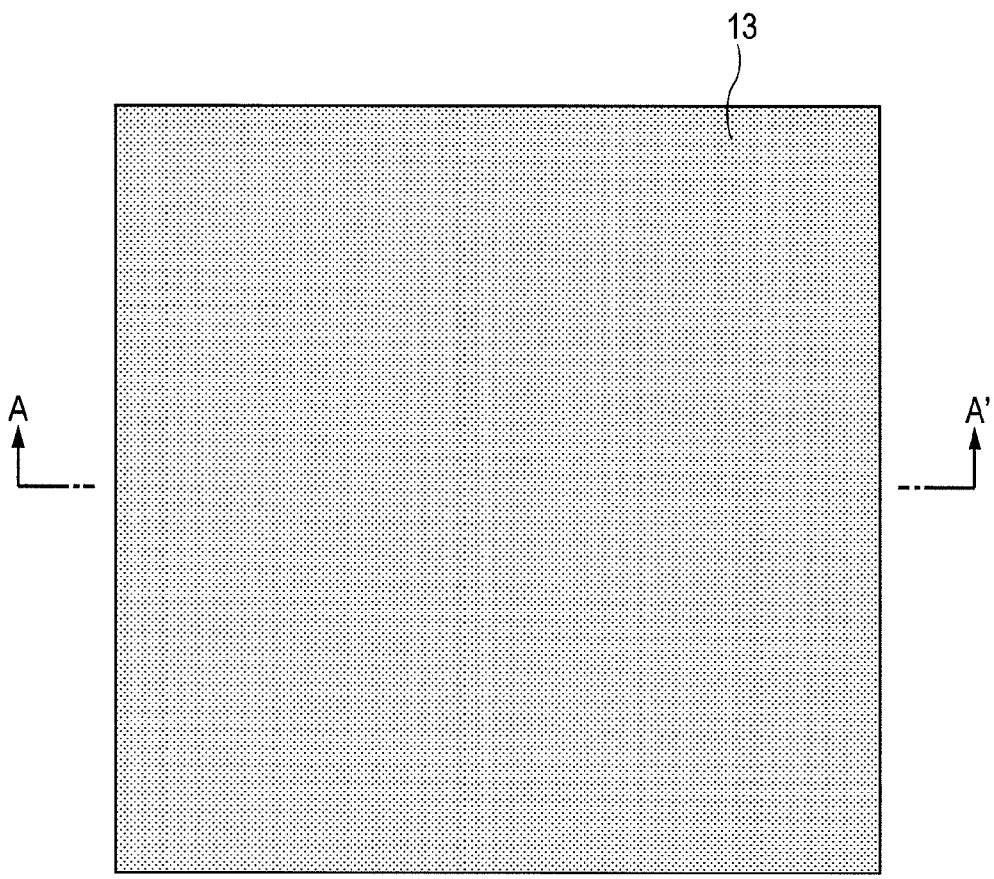
FIG. 11A exemplifies a plan view showing a thermal conductivity part attached to the top surface of the semiconductor device with thermal conductivity adhesive resin.
Figure 11B:
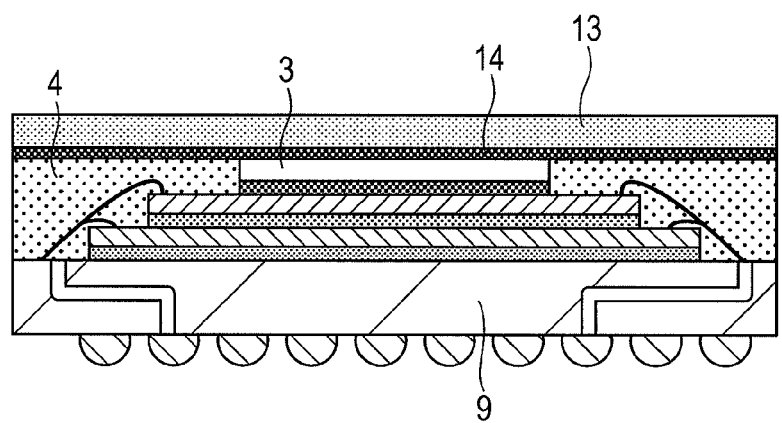
FIG. 11B exemplifies a sectional view showing a thermal conductivity part attached to the top surface of the semiconductor device with thermal conductivity adhesive resin.

FIGS. 11A and 11B show a modification of the embodiment. FIG. 11A is a plan view showing a thermal conductivity part attached to the top surface of the semiconductor device with thermal conductivity adhesive resin. FIG. 11B shows section A-A' of FIG. 11A. It is effective to increase the surface area of the thermal conductivity part for improving the radiation efficiency.

For this purpose, thermal conductivity adhesive 14 is applied to the structure shown in FIGS. 1A and 1B to bond the heat spreader 13. Materials for the heat spreader 13 include silicon or alumina ceramic or metal such as copper, for example.

The heat spreader 13 can be finned to increase the surface area.

Second Embodiment

Figure 12A:
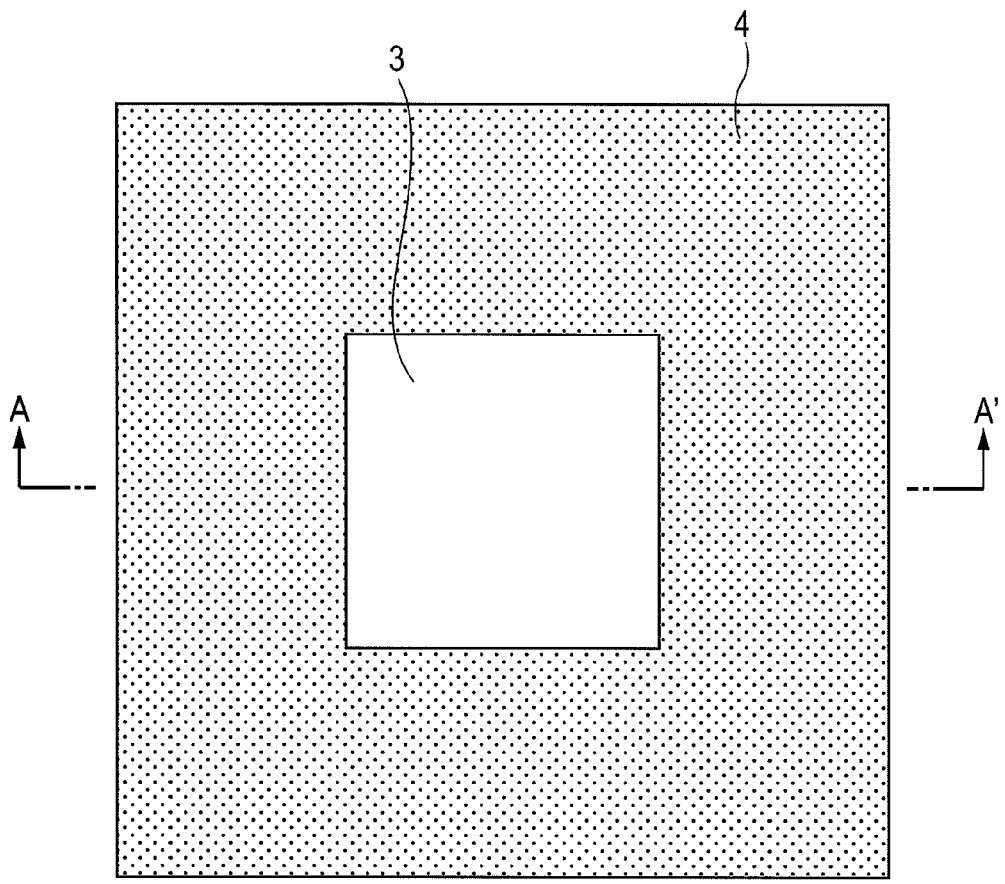
FIG. 12A exemplifies a plan view of a single-chip package structure according to a second embodiment.
Figure 12B:
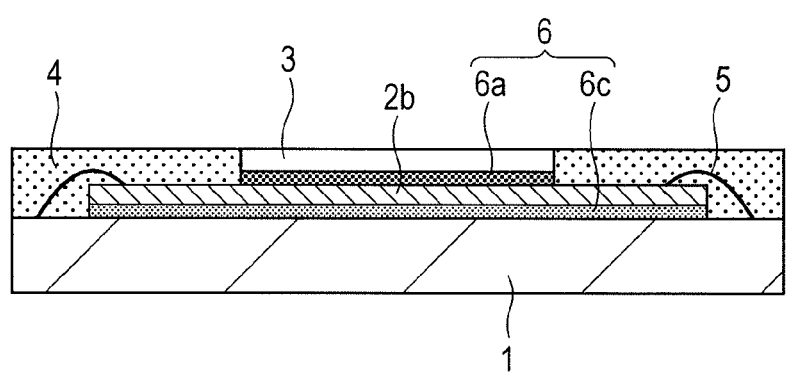
FIG. 12B exemplifies a sectional view of the single-chip package structure according to the second embodiment.

FIGS. 12A and 12B are a plan view and a cross sectional view illustrating a single-chip package structure without stacked semiconductor chips. FIG. 12B shows section A-A' of FIG. 12A. Even the single-chip structure is capable of exposing the thermal conductivity part 3 from the surface of the encapsulation resin 4 and hardening the adhesive sheet to form a bonding layer between the thermal conductivity part and the chip and a bonding layer between the semiconductor chip and the wired component. This method is capable of radiation control, heat resistance reduction, and miniaturization of the semiconductor package.

While there have been described specific preferred embodiments of the present invention, it is to be distinctly understood that the present invention is not limited thereto but may be otherwise variously embodied within the spirit and scope of the invention.

The present invention is effective for miniaturization, high integration, and heat resistance reduction of a semiconductor package using high-heat-generating ICs.

What is claimed is:

1. A semiconductor device comprising:
   a plurality of stacked semiconductor chips;
   a thermal conductivity part mounted over a device formation surface of a topmost one of the stacked semiconductor chips;
   first bonding layers provided between adjacent ones of the stacked semiconductor chips;
   a second bonding layer provided between the thermal conductivity part and the topmost one of the stacked semiconductor chips; and
   an encapsulation resin that seals the semiconductor chips,
   wherein the thermal conductivity part is exposed from a surface of the encapsulation resin;
   wherein adhesive sheets are hardened to form the first and second bonding layers;
   wherein each adhesive sheet is a different material from the encapsulation resin;
   wherein an amount of heat generation from the topmost one of the stacked semiconductor chips is larger than an amount of heat generation from another of the stacked semiconductor chips below said topmost one; and
   wherein a thickness of the second bonding layer is less than a thickness of one of the first bonding layers.

2. The semiconductor device according to claim 1,
   wherein a heat resistance between the thermal conductivity part and the topmost one of the semiconductor chips is smaller than a heat resistance between adjacent ones of the semiconductor chips.

3. The semiconductor device according to claim 1,
   wherein the thermal conductivity part is silicon.

4. The semiconductor device according to claim 1,
   wherein the thermal conductivity part is thinner than the topmost one of the semiconductor chips.

5. The semiconductor device according to claim 1,
   wherein a level difference is formed on a side of the thermal conductivity part.

6. The semiconductor device according to claim 1, comprising:
   a printed circuit board including a surface layer wiring and a grounded conductor layer that is internally formed through the surface layer wiring and an insulating layer,
   wherein the semiconductor chips and the thermal conductivity part are stacked on the printed circuit board.

7. The semiconductor device according to claim 1, comprising:
   a printed circuit board according to an LGA or BGA structure,
   wherein the semiconductor chips and the thermal conductivity part are stacked on the printed circuit board.

8. The semiconductor device according to claim 1,
   wherein an external exposure side of the thermal conductivity part is finned or dimpled.

9. The semiconductor device according to claim 1,
   wherein a radiation part is attached to an external exposure side of the thermal conductivity part.

10. The semiconductor device according to claim 1,
    wherein wires bonded to the semiconductor chips connect the semiconductor chips to each other or to a printed circuit board.

11. The semiconductor device according to claim 1, wherein each adhesive sheet is an adhesive tape.

* * * * *